United States Patent [19]

Yokozawa

[11] Patent Number: 5,590,051
[45] Date of Patent: Dec. 31, 1996

[54] PROCESS SIMULATION METHOD, PROCESS SIMULATOR AND CHEMICAL VAPOR DEPOSITION SYSTEM EMPLOYING THE SAME

[75] Inventor: Ayumi Yokozawa, Tokyo, Japan

[73] Assignee: NEC Corporation, Tokyo, Japan

[21] Appl. No.: 350,982

[22] Filed: Nov. 29, 1994

[30] Foreign Application Priority Data

Dec. 1, 1993 [JP] Japan .................................. 5-301383

[51] Int. Cl.⁶ .................................................. G06F 17/00
[52] U.S. Cl. ........................................... 364/496; 364/578
[58] Field of Search ..................................... 364/570, 578,
364/488–491, 496–500, 468; 221/24; 118/715,
716, 720; 437/225, 235–242

[56] References Cited

U.S. PATENT DOCUMENTS

| | | | |
|---|---|---|---|
| 5,067,101 | 11/1991 | Kunikiyo et al. | 364/578 |
| 5,070,469 | 12/1991 | Kunikiyo et al. | 364/578 |
| 5,307,296 | 4/1994 | Uchida et al. | 364/578 |
| 5,481,475 | 1/1996 | Young | 364/578 |

OTHER PUBLICATIONS

Ikegawa et al.; "Deposition Profile Simulation Using the Direct Simulation Monte Carlo Method"; J. Electrochem. Soc., vol. 136, No. 10, Oct. 1989, pp. 2982–2986.

*Primary Examiner*—James P. Trammell
*Attorney, Agent, or Firm*—Whitham, Curtis, Whitham & McGinn

[57] ABSTRACT

A process simulation method and a process simulator are disclosed wherein a simulation for optimum process conditions for formation of a dielectric film for a capacitor by a chemical vapor deposition method is executed using a non-empirical reaction model. The process simulator comprises an inputting apparatus for inputting parameters required to determine optimum process conditions, which provide the best step coverage for a dielectric film of a capacitor to be formed, as values defining given variation ranges, a storage apparatus for storing vapor phase reactions and film surface reactions individually corresponding to process condition sets each of which is a combination of a plurality of parameters as models obtained by a non-empirical method in advance, a simulation condition setting apparatus for setting process condition sets, a reaction model setting apparatus for recalling models from the storage apparatus in response to the thus set process condition sets, and a simulation execution apparatus for executing simulations in accordance with the thus recalled models and comparing results of the simulations with each other to select optimum process conditions.

7 Claims, 12 Drawing Sheets

FIG. 4 (A) INSERTION OF SiCl₂ INTO N-H BOND OF THE FILM SURFACE
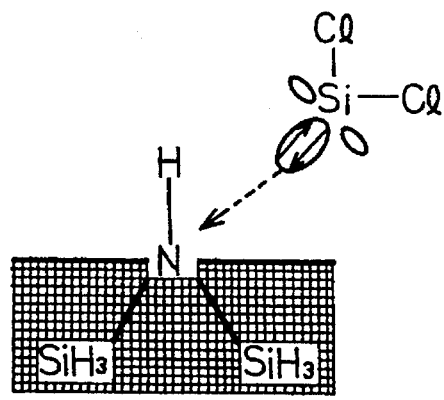
FIG. 4 (B)
FORMATION OF FIRST Si-N BOND
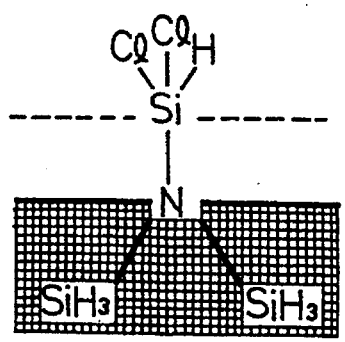
FIG. 4 (C)
DESORPTION OF HCl FROM THE FILM
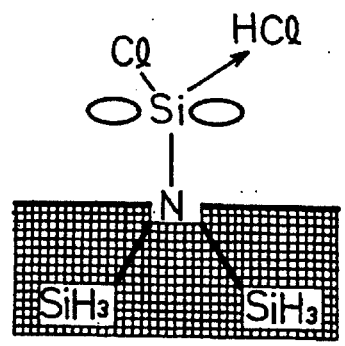

INSERTION OF SiX₂ TYPE SPECIES OF THE FILM SURFACE INTO N-H OF NH₃

FORMATION OF SECOND Si-N BOND

INSERTION OF SiCl₂ INTO A Si-H BOND OF THE FILM SURFACE

FORMATION OF Si-Si BONDS

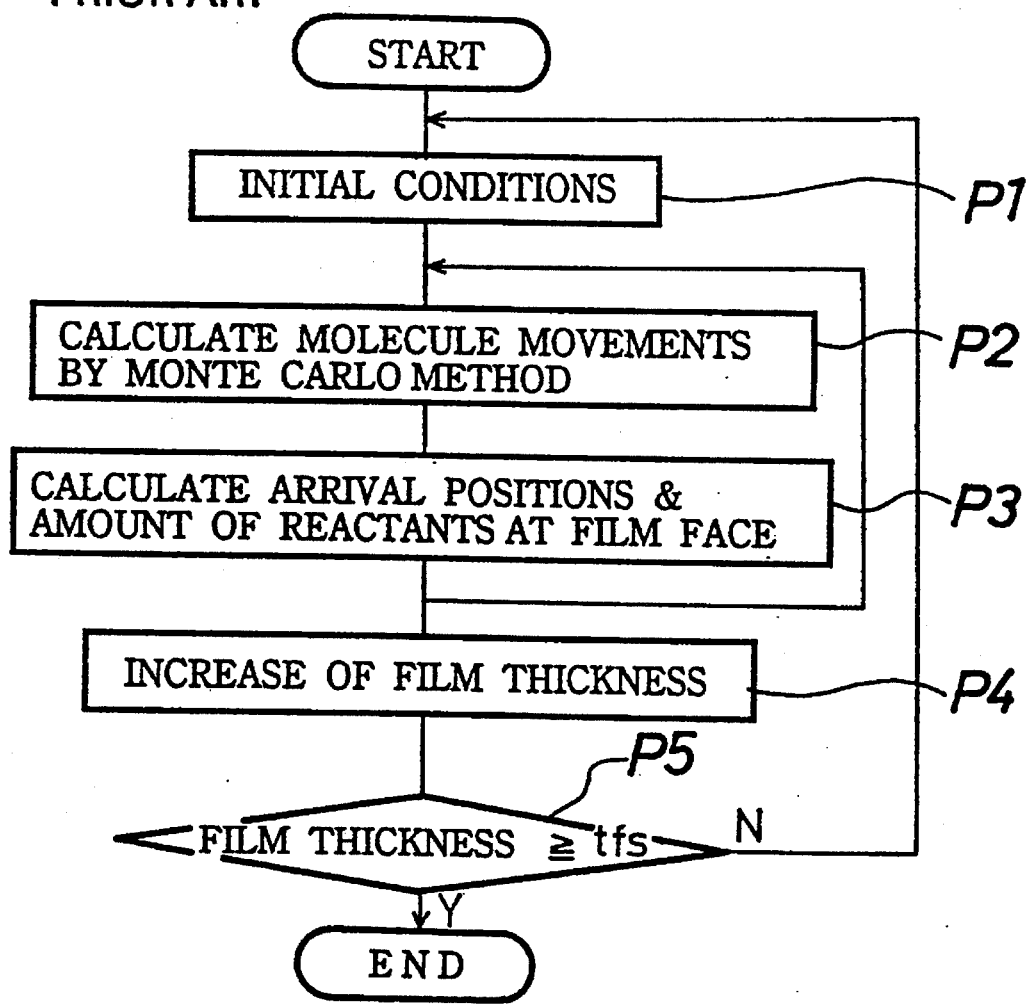

PROCESS SIMULATION METHOD, PROCESS SIMULATOR AND CHEMICAL VAPOR DEPOSITION SYSTEM EMPLOYING THE SAME

BACKGROUND OF THE INVENTION

1. Field of the Invention

This invention relates to a process simulation method, a process simulator and a chemical vapor deposition system employing the same, and more particularly to a process simulation method, a process simulator and a chemical vapor deposition system employing the same wherein process conditions upon formation of a dielectric film for a capacitor by a chemical vapor deposition (hereinafter referred to simply as CVD) method can be set automatically and non-artificially.

2. Description of the Related Art

In recent years, as the degree in integration of semiconductor devices goes up, increases in number of steps and cost in a manufacturing process and increases in time and cost required for development of the process make problems. For example, in a dynamic random access memory (DRAM), in order to obtain a large capacity, a dielectric film with a uniform thickness must be formed on a capacitor having a complicated electrode structure of such type as the trench type or the hemispherical grain (HSG) type. For the formation of a dielectric film on the above mentioned electrodes, the CVD method is principally employed since it is advantageous in that it gives a good step coverage of the dielectric film which is evaluated in terms of a ratio between the film thickness on the uppermost surface of a step and that on the side wall of the step (hereinafter referred to as coverage ratio) and that it can easily achieve selective deposition upon formation of a film. In order to reduce the time and the cost required for development of such process technique, a process simulator wherein optimum conditions for achieving a desired process are automatically set to a CVD apparatus has been proposed.

Here, how to set optimum CVD condition which gives the best step coverage of a dielectric film is considered. It is known that improvement in step coverage, where the theoretical value for the best step coverage is 1, can be achieved qualitatively by reducing the amount in material gases which arrive at the film surface and contribute to formation of the film, and by reducing the surface reaction coefficient of the species which will be hereinafter described. Accordingly, when the optimum CVD condition is automatically determined by a process simulator using certain parameters and the obtained optimum condition is required to be simultaneously set to the CVD system, it is necessary that, in the process simulator, the vapor phase reactions and the film surface reactions be treated without depending on any experimental results, that is, those reactions are non-empirically described.

One of the documents which describe a representative process simulator in which a step coverage of a thin film formed by a conventional CVD process is calculated by computer simulation is disclosed in M. Ikegawa and J. Kobayashi, Journal of Electrochemical Society, Vol. 136, No. 10, 1989, pp. 2,982–2,986. According to the simulator of the document, the procedure of growth of the film is simulated using such a model as shown in FIG. 9.

In the model shown in FIG. 9, it is assumed that a process region in which a film 103 is formed on a substrate surface 102 is constituted roughly from a vapor phase and a surface/solid phase. First, in the vapor phase, material gases are decomposed by heat, light or plasma so that a molecule which is liable to react, that is, a reactant 101, is produced. The reactant 101 arrives at the substrate after colliding with other molecules, and it is absorbed on the substrate surface 102. Meanwhile, in the surface/solid phase, the reactant 101 arriving at the substrate surface 102 follows either procedure; one is that the reactant causes the reaction on the substrate surface 102 to form a film 103, and the other is that it is reflected by the substrate surface 102 without causing any reaction with the substrate surface 102 and moves to a different position on the substrate surface 102. Such procedures are calculated for a large number of individual molecules and the results of the calculations are accumulated to simulate the growth of the film 103 in such a manner as illustrated in FIG. 10.

The flow chart of the process simulation is described by referring to FIG. 10. First initial conditions for the simulation, such as kinds of material gases and a process temperature are determined or chosen (step P1). Behavior of reactants 101 in the vapor phase is calculated by a Monte Carlo method (step P2) until they arrive at the substrate surface 102 or the film 103 from positions where they have been generated. From the results of the calculation, the positions of the reactants arriving on the substrate surface and the number of the reactants 101 arriving at a position on the substrate surface are obtained (step P3). Then, it is determined whether or not the thus arriving reactants 101 react with the surface of the film 103 at the individual positions of the surface (step P4). The thickness of the film 103 is increased as the amount of the reactants 101 which have reacted with the surface of the film 103. Whether or not reaction actually occurs is determined from the value of a surface reaction coefficient set in advance. For example, where the reaction coefficient is 1.0, all of the reactants 101 arriving at the surface of the film 103 react with the surface of the film 103, but where the reaction coefficient is 0.5, half of the reactants 101 arriving at the surface react with the surface. The operations at steps P1 to P4 are repeated until the thickness of the film 103 becomes equal to a predetermined thickness tfs (step P5).

A most significant factor in the calculation described above is a reaction coefficient which indicates the probability of the reactant causing the reaction, and the reaction coefficient is determined by the energy which is need for the reactant causing the reaction. Particularly, the step coverage is influenced significantly by the reaction coefficient at the surface of the film. For example, when the reaction coefficient becomes low, since the ratio in surface reflection becomes high, reactants can reach a deep portion or the bottom of a groove, that is, a trench, of a substrate. Consequently, the coverage ratio approaches unity.

As mentioned above, the reaction coefficient is an important parameter which has a significant influence on the step coverage of the film in CVD process. According to the conventional simulation, however, the value of the reaction coefficient is set to be an empirical value, or is so determined as to fit the simulation results, in which the reaction coefficient is set as an artificial parameter, to the experimental results. Therefore, in the conventional simulation, the optimum condition for causing the coverage ratio to approach unity is a semi-experimental condition determined only from a large number of results of experiments, and this does not satisfy the requirement for a non-empirical value described above. Further, a process wherein the step coverage is improved using such a result of the simulation as described above is insufficient for supporting the development of the CVD process described above since the dominant factor of step coverage is indefinite.

In short, the conventional process simulator described above is disadvantageous in that, since an empirically estimated value or an artificial or experiential corrected value with which a result of the simulation and the result of the experiment coincide with each other is used as a value of the reaction coefficient, a process optimum condition for improving the step coverage is a semi-experiential value based on a large number of experimental results and the requirement for a non-empirical value for automatically setting a result of a simulation on the real time basis as a process condition for a CVD process apparatus is not satisfied. Further, since the dominant factor of step coverage is indefinite, the conventional process simulator is further disadvantageous in that it is insufficient as a process simulator for supporting the development of a CVD process which optimizes the step coverage of a dielectric film.

SUMMARY OF THE INVENTION

It is an object of the present invention to provide a process simulation method and a process simulator in which dominant factors of step coverage are definite over all of steps of a process and by which the simulation time and the cost for development can be reduced remarkably comparing with those of a conventional process simulation method and a conventional process simulator in which a result of an experiment is used, and a chemical vapor deposition system in which the process simulation method and the process simulator are employed.

In order to attain the object described above, according to an aspect of the present invention, there is provided a process simulation method wherein a plurality of parameters required to determine optimum process conditions which provide a maximum step coverage of a dielectric film to be formed on an electrode of a capacitor by a chemical vapor deposition method by supplying a plurality of raw material gases to the electrode of a capacitor are inputted as values defining predetermined variation ranges and the thus inputted parameters are individually varied to select optimum process conditions, comprising the steps of setting a plurality of process condition sets of different combinations from the plurality of inputted parameters, recalling, from a data base in which vapor phase reactions and film surface reactions individually corresponding to a plurality of process condition sets are stored as models obtained by a non-empirical method in advance, those of the vapor phase reaction models and the film surface reaction models which correspond to the individual process condition sets, and executing simulations of a vapor phase reaction and a film surface reaction in accordance with the thus recalled vapor phase reaction step models and film surface reaction step models and comparing results of the simulations with each other to select optimum process conditions.

According to another aspect of the present invention, there is provided a process simulator, which comprises an inputting apparatus for inputting a plurality of parameters required to determine optimum process conditions, which provide a maximum step coverage of a dielectric film to be formed on an electrode of a capacitor by a chemical vapor deposition method by supplying a plurality of raw material gases to the electrode of a capacitor, as values defining predetermined variation ranges, a simulator section for individually varying the parameters inputted from the inputting apparatus to select optimum process conditions, and a storage apparatus for storing vapor phase reactions and film surface reactions individually corresponding to a plurality of condition sets, which have been obtained by a non-empirical method in advance, the simulator section including a simulation condition setting apparatus for setting a plurality of process condition sets which are each a combination of a plurality of parameters inputted from the inputting apparatus, a reaction model setting apparatus for recalling vapor phase reaction models and film surface reaction models from the storage apparatus in response to the process condition sets supplied from the simulation condition setting apparatus, and a simulation execution apparatus for performing simulations of vapor phase reactions and film surface reactions using the vapor phase reaction models and the film formation reaction step models supplied from the reaction model setting apparatus and comparing results of the simulations with each other to determine optimum process conditions.

The non-empirical method for obtaining the reactions for both vapor phase and film surface may be an ab-initio molecular orbital method which is based on a principle of the quantum chemistry by which individual molecule orbitals of raw material gas are obtained.

The plurality of raw material gases may include $SiH_2Cl_2$ or $SiH_4$ and $NH_3$.

The parameters to be inputted may include kinds of the raw material gases, pressures of the individual raw material gases, and flow rates of the raw material gases.

The process simulator may further comprise a reaction model determination section having a molecular orbital calculation program for developing a reaction model using the data stored in the storage apparatus.

According to a further aspect of the present invention, there is provided a chemical vapor deposition system, comprising a process simulator described above, and a chemical vapor deposition apparatus for receiving optimum process conditions from the process simulator and performing a process of a chemical vapor deposition method under the optimum process conditions.

The chemical vapor deposition apparatus may include a control apparatus for CVD condition including a gas flow control section, a temperature control section and a time control section, a process condition setting section for setting the optimum process conditions to the CVD condition control apparatus, and a process execution section for performing a chemical vapor deposition process under the optimum process conditions set by the process condition setting section.

With the process simulation method, the process simulator and the chemical vapor deposition system of the present invention, a non-empirical simulation in which dominant factors of a step coverage are made definite over the entire process can be executed. Accordingly, the simulation time and the cost for developing CVD process which provides the best step coverage can be reduced remarkably comparing with those of the prior art in which a result of an experiment is employed.

The above and other objects, features and advantages of the present invention will become apparent from the following description and the appended claims, taken in conjunction with the accompanying drawings in which like parts or elements are denoted by like reference characters.

BRIEF DESCRIPTION OF THE DRAWINGS

FIG. 10 is a flow chart illustrating a procedure of a conventional CVD simulation for determination of optimum conditions for a process.

DESCRIPTION OF THE PREFERRED EMBODIMENT

A simulation for optimization of a step coverage in a CVD process is required to simulate vapor phase reactions and film surface reactions non-empirically as described hereinabove in connection with the prior art. In the present invention, those reaction processes are modeled by an ab-initio molecular orbital calculation, and simulation of a CVD process is performed based on the model thereby to allow non-empirical simulation.

Figure 1:
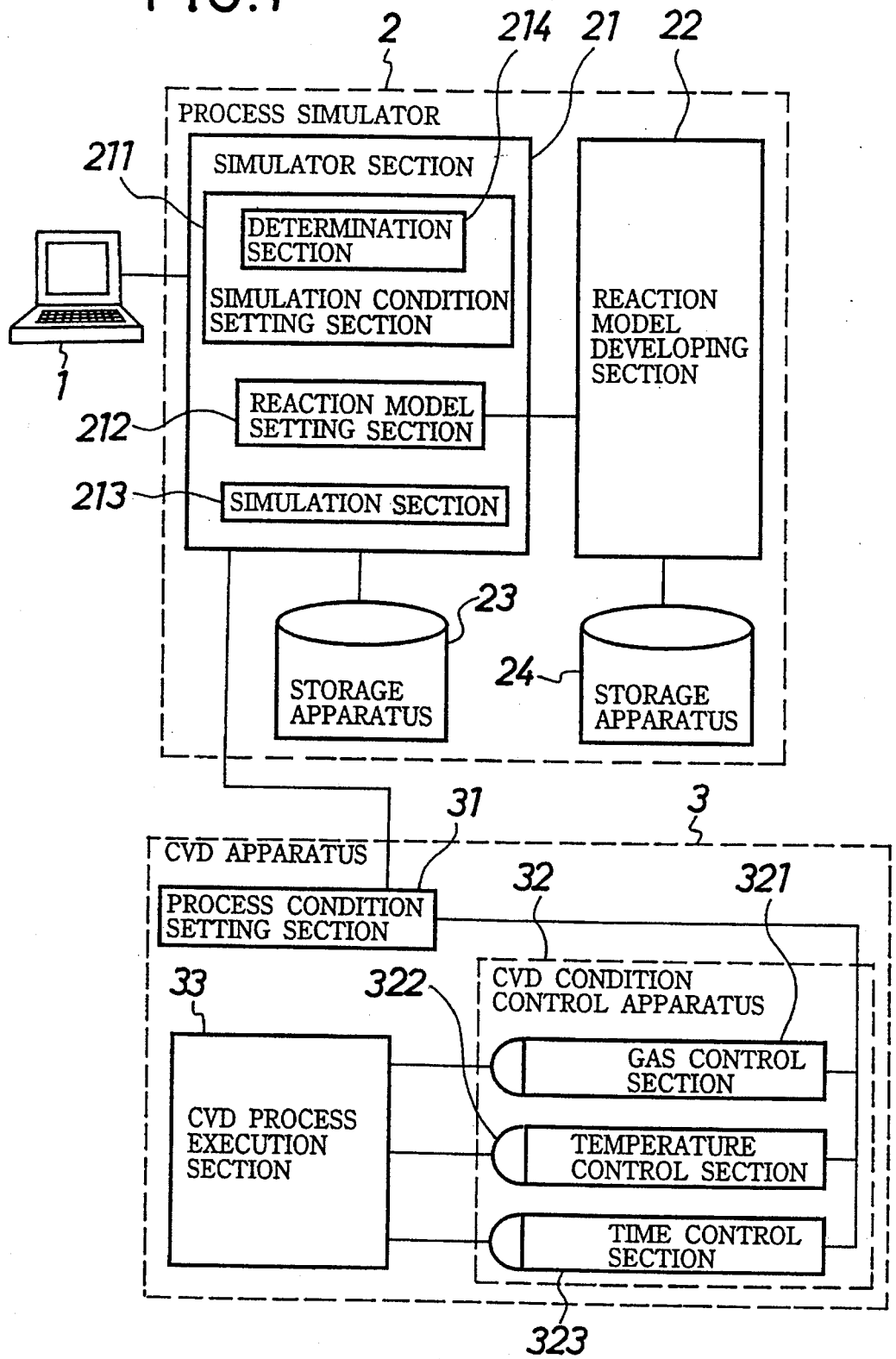
FIG. 1 is a block diagram of a process simulator and a chemical vapor deposition system which employs the process simulator showing a preferred embodiment of the present invention.

FIG. 1 shows a process simulator and a system including a CVD apparatus which employs the process simulator according to a preferred embodiment of the present invention. Referring to FIG. 1, the system shown includes an inputting apparatus 1 for inputting therethrough a desired CVD condition, an acceptable range of the simulation and so forth, a process simulator 2 for carrying out a simulation for the CVD process, and a CVD apparatus 8 for receiving the result of simulation from the process simulator 2 and performing the CVD process.

The process simulator 2 includes a simulator section 21 including two engineering work stations (EWSs) for carrying out a plurality of simulations for a desired process in parallel, a reaction model developing section 22 including EWSs similar to those of the simulator section 21 and having an ab-initio molecular orbital calculation program for executing, when a reaction model which is not included in a data base is required, a calculation newly to determine such reaction model, a storage apparatus 23 for storing results of simulation, and another storage apparatus 24 connected to the reaction model developing section 22 and serving as a data base in which CVD reaction models of various gases obtained as results of molecular orbital calculations of reaction procedures are stored.

The simulator section 21 includes a simulation condition setting section 211 for setting a condition for a simulation, a reaction model setting section 212 serving as a program section for determining a reaction model corresponding to a given process condition using data of the storage apparatus 24, and a simulation section 213 having a CVD process simulation program. The simulation condition setting section 211 includes a determination section 214 for determining whether or not there is a simulation result corresponding to an inputted set of process conditions.

The CVD apparatus 3 includes a CVD condition control apparatus 32 including a gas control section 321, a temperature control section 322 and a time control section 323, a process condition setting section 31 for setting the conditions of a CVD process for the CVD condition control apparatus 32 to optimum process conditions determined from the CVD process simulation, and a CVD process execution section 33 for executing a CVD process under the conditions set by the process condition setting section 31.

One of the two EWSs of the simulator section 21 carries out a simulation regarding vapor phase reactions of the CVD process to obtain arrival distributions of reactants at the surface of a substrate under given process conditions including gas pressures, gas flow rates and a processing temperature. Meanwhile, the other engineering work station carries out a simulation for growth of a film by the CVD based on the obtained arrival distributions of the reactants.

The way of automatically setting process conditions in the process simulator of the present embodiment will be described below with reference to FIG. 1. First, ranges for process conditions corresponding to a required CVD process, ranges peculiar to the process apparatus, ranges of variation of the process conditions corresponding to a quality standard or the like, and so forth are inputted from the inputting apparatus 1. The simulation condition setting section 211 determines a set of process conditions such as a temperature, kinds of gases, gas pressures, gas flow rates and a processing time to be sent to the simulation section 213 within the process condition ranges mentioned above. Further, the simulation condition setting section 211 examines presence or absence of simulation result corresponding to the set of process conditions by means of the determination section 214, and if presence of the required result is confirmed, then the result is stored as it is, but on the contrary, if absence of such result is confirmed, then the simulation condition setting section 211 supplies the set of process conditions to the simulation section 213. In this instance, the process condition set is simultaneously sent to the reaction model setting section 212. The reaction model setting section 212 determines a reaction model corresponding to the given process condition set and supplies the model to the simulation section 213. But when such required reaction model is not found out in the storage apparatus 24, a calculation is carried out in the reaction model developing section 22 using an ab-initio molecular orbital calculation program to obtain a new reaction model, and the obtained new reaction model is supplied to the reaction model setting section 212. After the simulation is completed, the result of the simulation is stored into the storage apparatus 23. After all simulations are completed, optimum process conditions with which, for example, the coverage ratio exhibits its best value are deduced from the results of simulations. The optimum process conditions thus determined are supplied to the process condition setting section 31. The above described procedure are executed by the process simulator 2.

The process condition setting section 31 gives the values of the optimum process conditions to the CVD condition control apparatus 32 provided for the CVD process execution section 33 in order to set the process executing conditions of the CVD process execution section 33 to the optimum process conditions obtained by the simulations described above. The optimum process conditions obtained by the simulation section 213 are automatically set to the CVD process execution section 33 in this manner.

Figure 2:
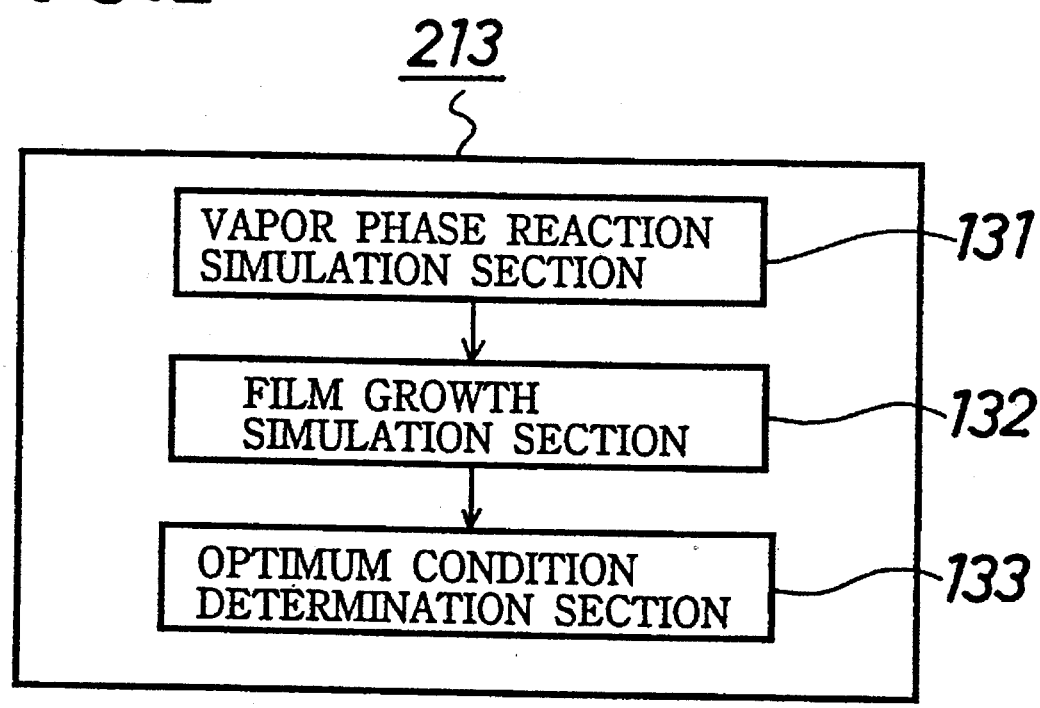
FIG. 2 is a block diagram showing the construction of a simulation section in the process simulator shown in FIG. 1.

The construction of the simulation section 213 which is an important feature in the present invention is shown in FIG. 2. Referring to FIG. 2, the simulation section 213 shown includes a vapor phase reaction simulation section 131 for simulating reactions or movement of reactants in a vapor phase and calculating the arrival distribution of reactants at the surface of a substrate under the conditions of a gas pressure, a gas flow rate and a temperature condition given as a result of the simulation, a film growth simulation section 132 for simulating film deposition using the arrival distribution obtained by the vapor phase reaction simulation section 131 in order to calculate step coverage, and an optimum condition determination section 133 for determining optimum process conditions from a result of calculation for step coverage.

Figure 3:
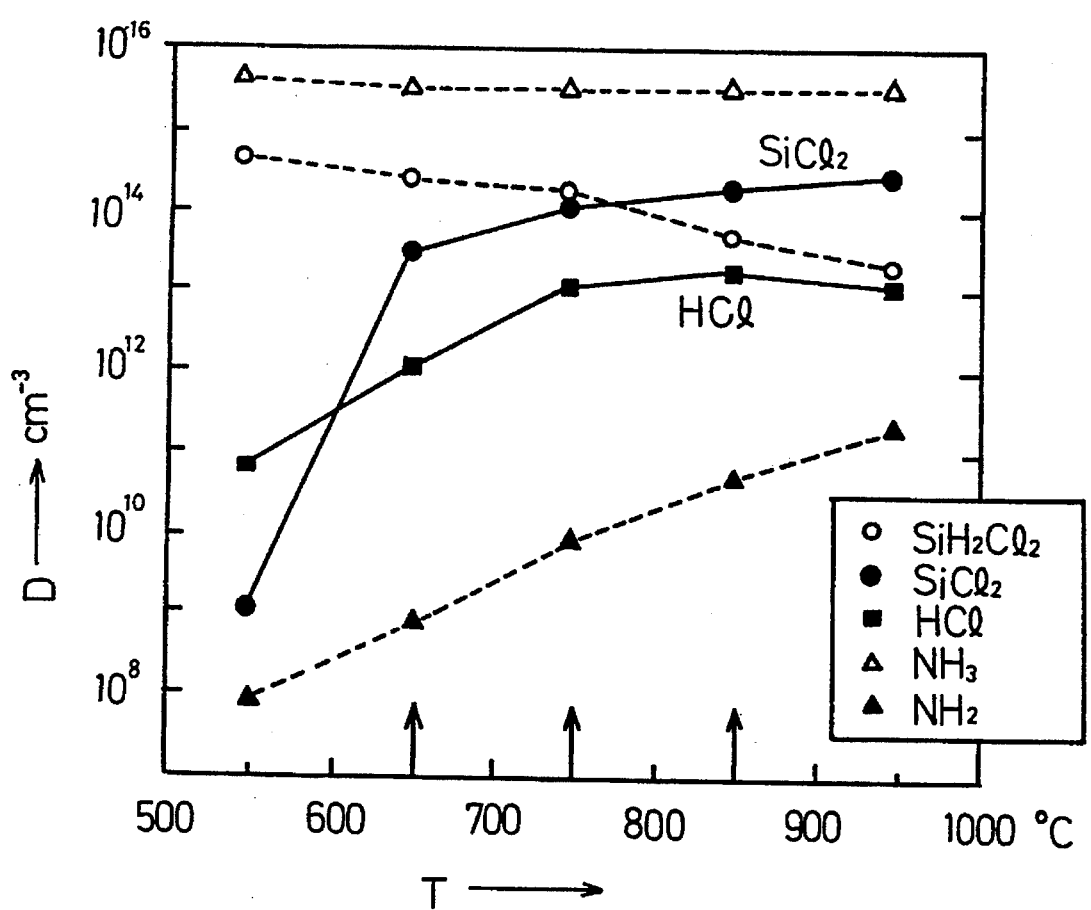
FIG. 3 is a graph showing an example of a vapor phase reaction model.
Figure 4D:
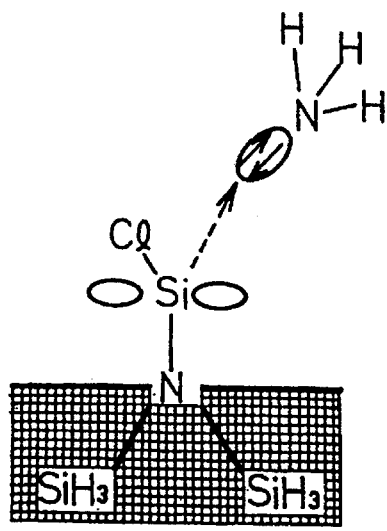
FIGS. 4(A) to 4(G) are diagrammatic views illustrating different steps of deposition in a reaction model of growth of a silicon nitride film.
Figure 4E:
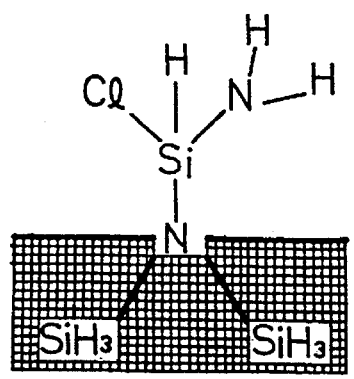
Figure 4F:
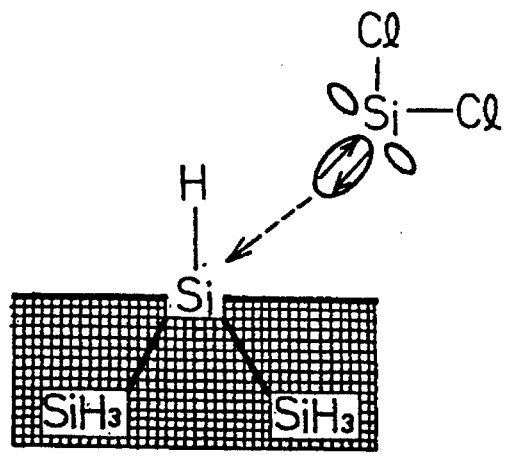
Figure 4:
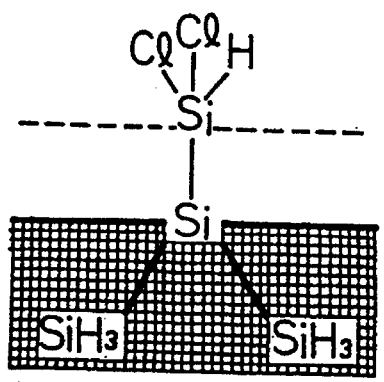

In operation of the simulation section 213, reactions and transportation of reactants in a vapor phase are calculated solving a diffusion equation. First, as for reactions in vapor phase, a reaction model set by the reaction model setting section 212 is employed. An example of such reaction model is illustrated in FIG. 3. The reaction model shown in FIG. 3 shows an example of a calculated result of densities D of reactants, $SiCl_2$ and HCl, in dichlorosilane ($SiH_2Cl_2$) and ammonia ($NH_3$) mixture where the range of the temperature T was set to 550° C. to 950° C.

Using the density of the reactants calculated by the vapor phase reaction simulation section 131, film growth is simulated by a Monte Carlo method in the film deposition reaction simulation section 132. For a simulation of the film growth, first, the arriving positions of reactants on the film surface; second, the kinds of the arriving reactants; third, the frequencies of occurrences of reactions of the reactants on the film surface; and fourth, the frequencies of occurrences of desorption reaction on the film surface, are required. The frequencies of the occurrences of the reactions or desorption are determined using a random number as described below in order to perform the simulation described above. It is noted that, in the present embodiment, a trench structure is assumed as an electrode structure.

1. Determination of Arriving Positions of Reactants

If speeds of reactants in vapor are isotropic, then the arriving flux of reactants at individual points of the surface of a trench increase in proportion to angles of elevation indicated by solid angles from the individual points. If, for example, the arriving flux $\Gamma_{total}$ of reactants at a point A on the uppermost surface of a trench from the points of the angle of elevation $\theta_A$ is 1, then the arriving flux at another point B on the side wall of the trench from the points of the angle of elevation $\theta_B$ is given by $\theta_B/\theta_A$. The arriving flux $\Gamma_{total}$ is given by the following formula:

$$\Gamma_{total}=(\tfrac{1}{4})nV_{ther}[cm^{-1}\ s^{-1}]$$

where n is the concentration of the reactant, $V_{ther}$ is a thermal velocity of the reactant=$[8kT/\pi M]^{-\tfrac{1}{2}}$, k is a Boltzmann constant, and T is a temperature of the system.

2. Determination of Kind of Arriving Reactant

A reactant is determined by comparing the ratio in concentration of the reactant in a vapor phase with a random number $\xi_1$. For example, where three kinds of reactants X, Y and Z exist and the concentration ratio of each of of them is X=0.5, Y=0.3 and Z=0.2, if the random number $\xi_1$ is 0.7, then the reaction species Y is selected.

3. Determination of Reaction Frequency

It is assumed that all of the reactions are of Arrhenius type. In this instance, the reaction frequency is in proportion to $A_0\exp(-\epsilon_a/kT)$, where $A_0$ is a frequency factor, and $\epsilon_a$ is an activation energy of the reaction.

In this instance, whether or not the reaction occurs is determined by comparison between the value of the expression $A_0\exp(-\epsilon_a/kT)$ and a uniform random number $\xi_2$ of 0.1. In other words, it is determined that the reaction occurs when the following equation is satisfied:

$$-\ln\xi_2 \geq (-\epsilon_a/kT)$$

4. Also the desorption reaction frequency from the surface of a film can be determined in a similar manner as in (3) above.

The reactions of individual reactants arriving at the film surface from a vapor phase are traced in accordance with the obtained model to simulate a CVD process.

The reaction or activation energy used in the present simulation is obtained by an ab-initio molecular orbital calculation. The determination of a reaction model by such an ab-initio molecular orbital calculation will be described subsequently. In particular, in low pressure chemical vapor deposition (LPCVD) for a silicon nitride film, reaction steps such as (1) thermal decomposition of mother gas, (2) surface absorption of the reactants and Si—N bonds formation and (3) desorption of the absorbed species and desorption of the species from the film surface are involved. When the material gas is $SiH_2Cl_2/NH_3$, the following thermal decomposition reactions of the gas may be involved:

$$SiH_2Cl_2 \rightarrow SiCl_2 + H_2 \tag{1}$$

$$SiH_2Cl_2 \rightarrow SiHCl + HCl \tag{2}$$

$$NH_3 \rightarrow NH_2 + H \tag{3}$$

$$NH_3 \rightarrow NH + H_2 \tag{4}$$

The reaction energies of the above described reaction systems are calculated by am ab-initio molecular orbital calculation method. In the present example, the reaction energies of the equations (1) and (2) are obtained to be much lower than those of the equations (3) and (4). Accordingly, it can be determined that the reactants in a vapor phase are principally $SiCl_2$ and SiHCl which are produced by thermal decomposition of $SiH_2Cl_2$.

Subsequently, as regards reactions on the film surface, considering a molecule of a certain size as a local portion of the film, a reaction of the molecule with reactants produced in the vapor phase is determined from an ab-initio molecular orbital calculation based on a principle of the quantum chemistry. For example, formation of Si—N bonds is calculated in accordance with the following reaction:

$$SiCl_2 + NH_3 \rightarrow SiHCl_2NH_2 \tag{5}$$

In order to simulate the growth of a silicon nitride film, the formation of Si—N bonds must successively occur. The successive formation of Si—N bonds is modeled as follows. $SiCl_2NH_2$ produced by the reaction described above changes to SiClNH$_2$ by desorption of HCl from SiCl$_2$NH$_2$ as given by the following expression:

$$SiClNH_2 \rightarrow SiClNH_2 + HCl \qquad (6)$$

Since SiCl$_2$NH$_2$ has dangling bonds and is in the form of SiX$_2$ (X=Cl, NH$_2$), it can react with NH$_3$ in the same manner as SiCl$_2$ and form new Si—N bond.

The growth of a silicon nitride film is modeled with repetition of insertion reaction of SiCl$_2$ into N—H or Si—H bonds on the film surface and desorption of HCl from the film surface which is terminated by H or Cl. Referring to FIGS. 4(A) to 4(G) which schematically illustrate the growth model of a silicon nitride film, SiCl$_2$ produced by thermal decomposition of SiH$_2$Cl$_2$ by a reaction of (1) is first inserted into N—H bonds on the film surface (FIG. 4(A)) so that N—SiHCl$_2$ bonds are produced (FIG. 4(B)) of the surface. Then, HCl is desorbed from this N—SiHCl$_2$ of the surface while a Si—Cl bond remains on the surface (FIG. 4(C)). Since the Si—Cl bond (Si—Cl site) is in the form of SiX$_2$ which has two dangling bonds, it reacts with the N—H bond of NH$_3$ from the vapor phase (FIG. 4(D)) so that new Si—N bond is formed (FIG. 4(E)). SiCl$_2$ can insert also into the Si—H(Cl) bond on the film surface so that a Si—Si bond is also formed (FIGS. 4(F) and 4(G)). The reaction energy of this Si—Si bond formation is of the Si—N formation shown in FIG. 4(A). The growth of the film proceeds by repetition of the steps described above.

As described above, reaction energies of all of possible reaction systems are calculated, and reaction paths having small reaction energies sufficient to cause the reactions to occur under a given process temperature are selected. The reaction paths and reaction energies are determined for each reaction step including (1) the thermal decomposition of the material gases, (2) surface absorption of the reactants, and the formation of Si—N bonds and (3) desorption of the absorbed species and desorption of the species from the film surface. The reaction model developing section 22 executes the calculation for the reaction energies described above for the species of gases supplied thereto, and stores the thus produced reaction model into the storage apparatus 24.

Figure 5:
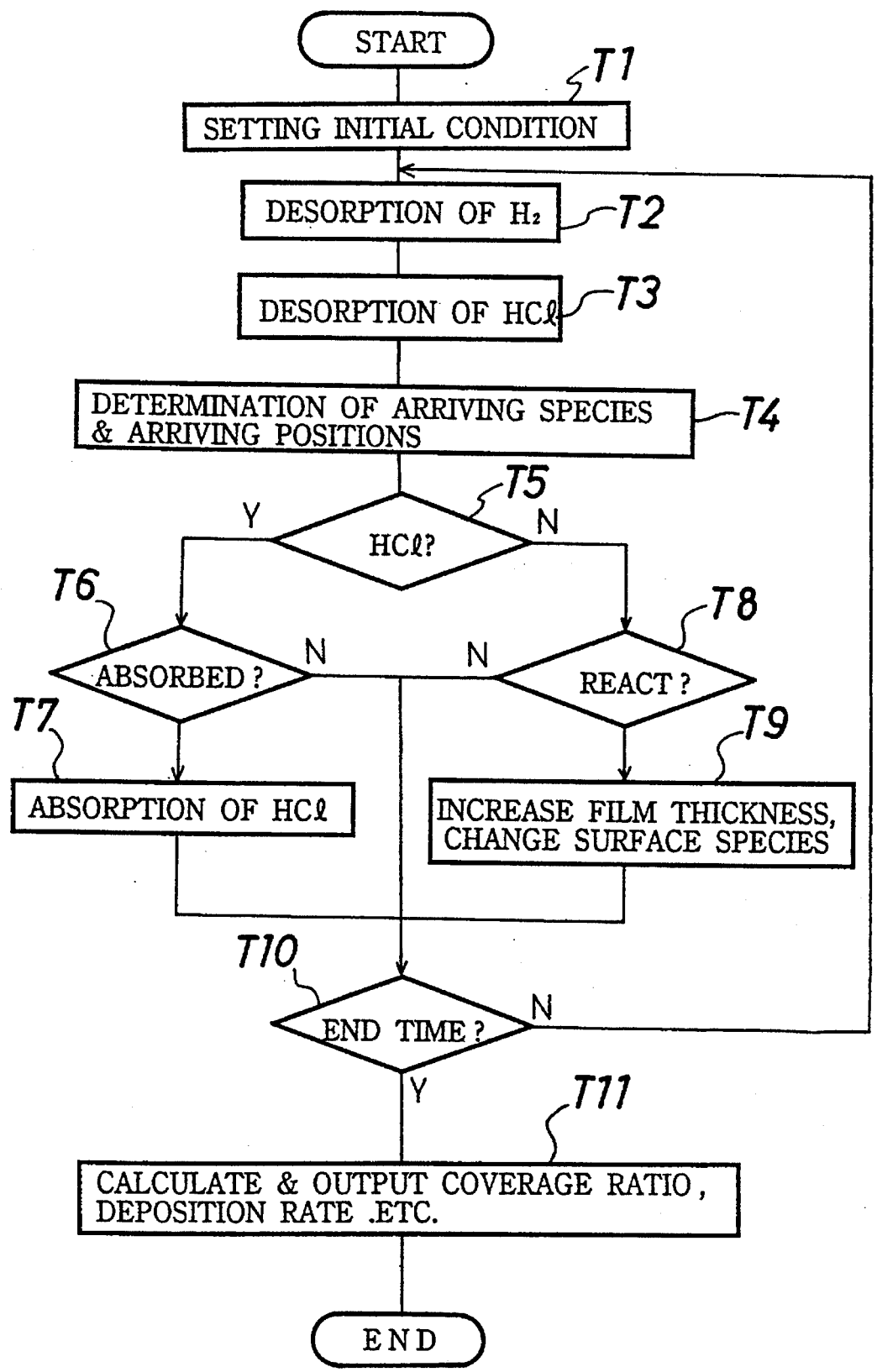
FIG. 5 is a flow chart illustrating a procedure of a chemical deposition simulation for a silicon nitride film executed in the process simulator shown in FIG. 1.

FIG. 5 shows a flow chart of procedures of the film growth simulation section 132 by a Monte Carlo method based on the reaction model produced in such a manner as described above. Referring to FIG. 5, the film growth simulation section 132 first sets initial conditions such as kinds of gases to be supplied, a processing temperature, and so on (step T1). Then, reactions of desorption of H$_2$ and HCl of (1) and (2) are calculated (steps T2 and T3). Next, a species to arrive at the film surface and the arriving position are determined (step T4). Then, it is determined whether or not the species is HCl (step T5). If the reactant is HCl, the control sequence advances to step T6, at which it is determined whether or not the species is absorbed. If the determination is in the affirmative, calculation of absorption of HCl is executed at step T7, whereafter the control sequence advances to step T10. On the other hand, if the determination at step T6 is in the negative, that is, the HCl species is not absorbed, the control sequence advances directly to step T10. On the other hand, if the determination at step T5 is in the negative, that is, the arriving species is not HCl, the control sequence advances to step T8, at which it is determined whether or not the species reacts with the bonds or dangling bonds of the film surface. If the determination is in the affirmative, the control sequence advances to step T9, at which a new Si—N or Si—Si bond formation is calculated, the thickness of the film is increased, and the species of the bonds of the film surface is changed, whereafter the control sequence advances to step T10. On the contrary, if the determination at step T8 is in the negative, that is, the species does not react, then the control sequence directly advances to step T10. At step T10, it is determined whether or not all reactions required are completed. If the determination is in the negative, the control sequence returns to step to repeat the operations at steps T2 to T9. If the determination at step T10 is in the affirmative, the control sequence advances to step T11, at which step coverage, a deposition rate of the film and so forth are calculated and outputted, thereby ending the simulation procedure.

Figure 6:
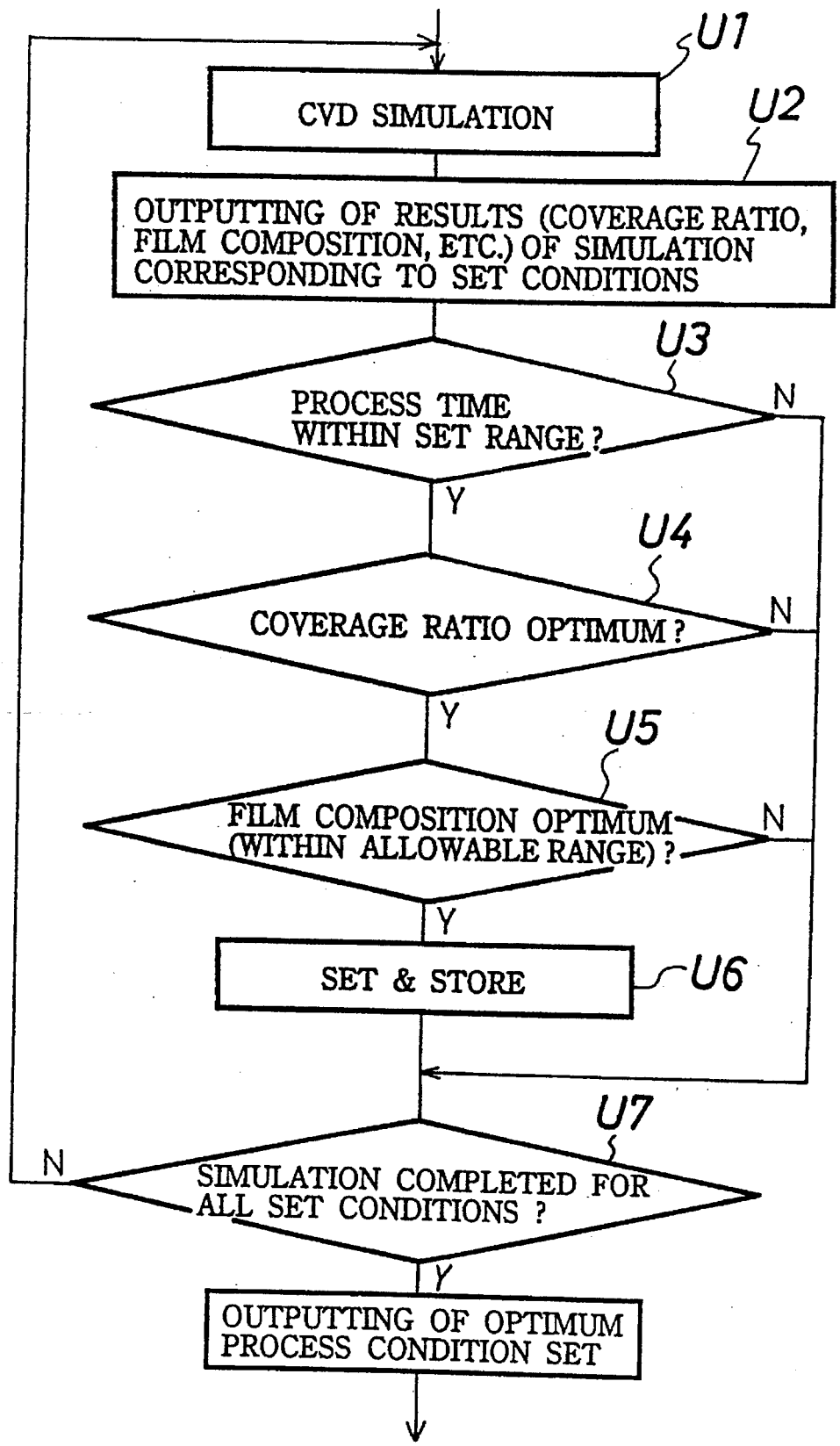
FIG. 6 is a flow chart illustrating a procedure of process optimum condition determination executed in the process simulator shown in FIG. 1.

FIG. 6 illustrates determination of an optimum CVD condition executed by the optimum condition determination section 133. Referring to FIG. 6, a simulation is first executed with a single process condition (step U1), and parameters such as a coverage ratio, a film composition and a process time corresponding to the set condition are determined based on a result of the simulation as described above (step U2). The parameters are compared with individual optimum values which have been applicable under the set condition within given ranges to successively determine whether or not the process conditions are optimum, that is, whether or not the process time is within the given range (step U3), whether or not the coverage ratio is optimum (step U4) and whether or not the film composition is optimum (step U5). If the determinations at all of steps U3 to U5 are in the affirmative, then the set conditions are stored as a set of optimum process conditions (step U6). Then, it is determined whether or not such determination has been performed for all of the set conditions (step U7), and then the sets of optimum process candidates are outputted (step U8).

Figure 7:
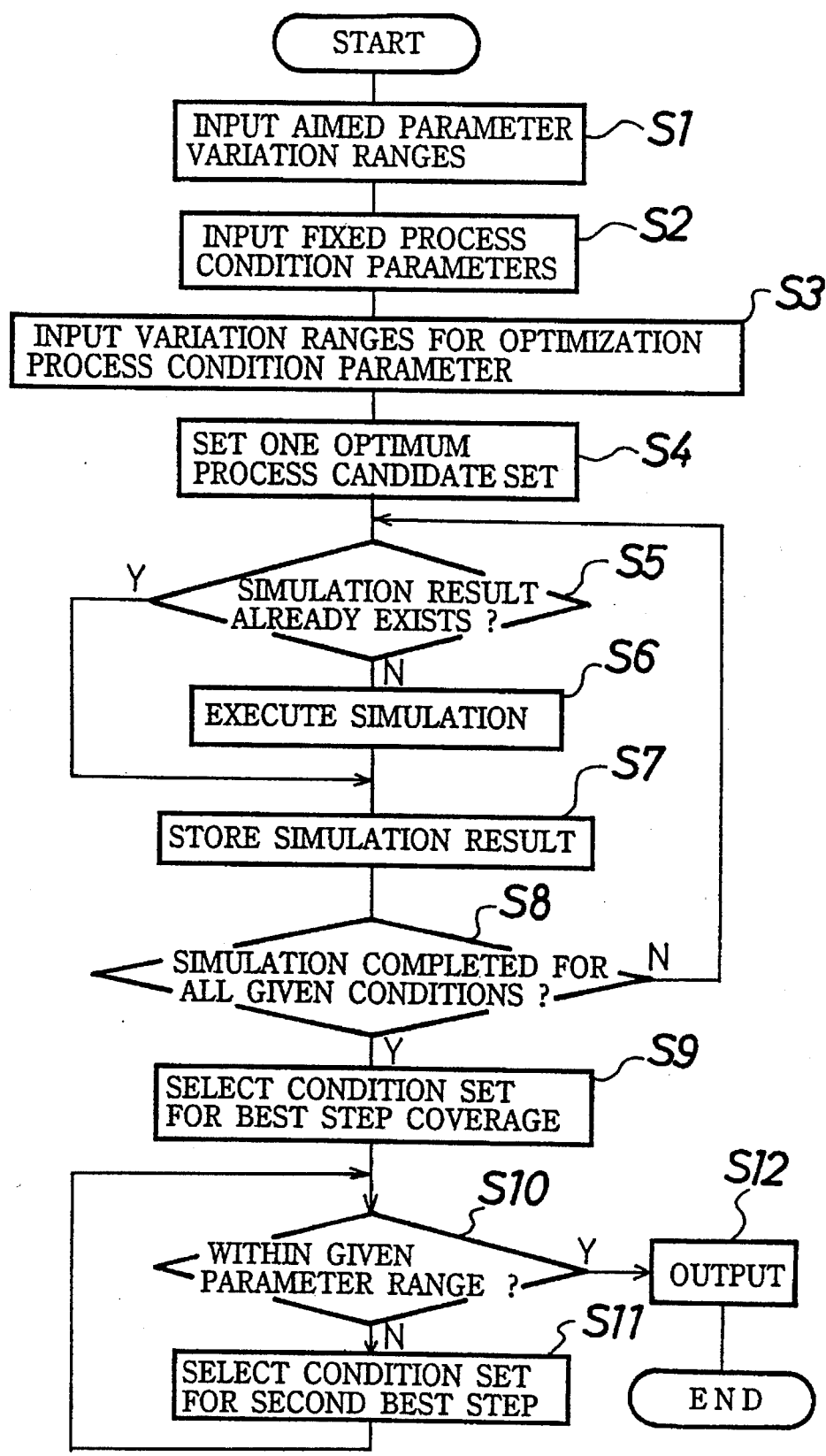
FIG. 7 is a flow chart illustrating a procedure of a simulation for determining optimum conditions of a process executed in the process simulator shown in FIG. 1.

Procedures of a process simulation in the present embodiment will be described in more detail with reference to FIG. 7 which illustrates the procedures beginning with a simulation by the simulation condition setting section 211 and the simulation section 213 and ending with determination of optimum process conditions. First, variation ranges of aimed parameters such as a film deposition rate and a film composition ratio in addition to a coverage for a film of an object for formation are inputted (step S1). Then, fixed parameter values of process conditions to be fixed are inputted (step S2). Further, variation ranges for the parameters of process conditions are inputted (step S3). The process condition variation ranges are set within a control range peculiar to the CVD process execution section 33 and so forth. Next, the parameters of the process conditions are varied within the individually given ranges to determine a set of process conditions which make candidates for an optimum process, that is, an optimum process condition set (step S4). Then, it is detected whether or not a result of a simulation corresponding to the optimum process condition set exists on the data base (step S5). If such result exists already, it is determined that the simulation is completed, whereafter the control sequence advances to step S7. If such result is not found at step S5, a simulation is condition under the conditions of the optimum process candidate set (step S6). A result of the simulation is stored into the data base of the storage apparatus 23 (step S7). Then, it is determined whether or not simulations have been completed for optimum process condition sets which satisfy all of the conditions within the given ranges (step S8). Thereafter, that one of all of the optimum process condition sets which provide the best coverage is selected (step S9). Then, it is determined whether or not the parameters other than the coverage remain within the control ranges under the conditions of the selected optimum process condition set. If the determination is in the negative, the determination is performed for that one of the optimum process candidate sets which exhibits the second best coverage. The operations are repeated to select a single optimum process condition set from within the plurality of optimum process candidate sets (steps S10 and S11). Then, the parameters of the optimum process condition set thus selected are outputted (step S12).

Where the simulation described above is applied to formation of a silicon nitride $Si_3N_4$ film for a dielectric film of a capacitor from gases of dichlorosilane ($SiH_2Cl_2$) and ammonia ($NH_3$) by a low pressure chemical vapor deposition (LPCVD) method, when the process temperature T as a desired process condition is varied with the step of 50° C. within the range from 700° C. to 900° C. while the pressures of the gasses are all fixed to 0.4 Torr and the ratio of gas flow rates of $SiH_2Cl_2$ and $NH_3$ is varied to three values of ½, ⅕ and ⅒, a total of 15 process condition sets are given in order to obtain the coverage c, the film deposition rate a and the film composition ratio b for each of the temperatures.

Figure 8:
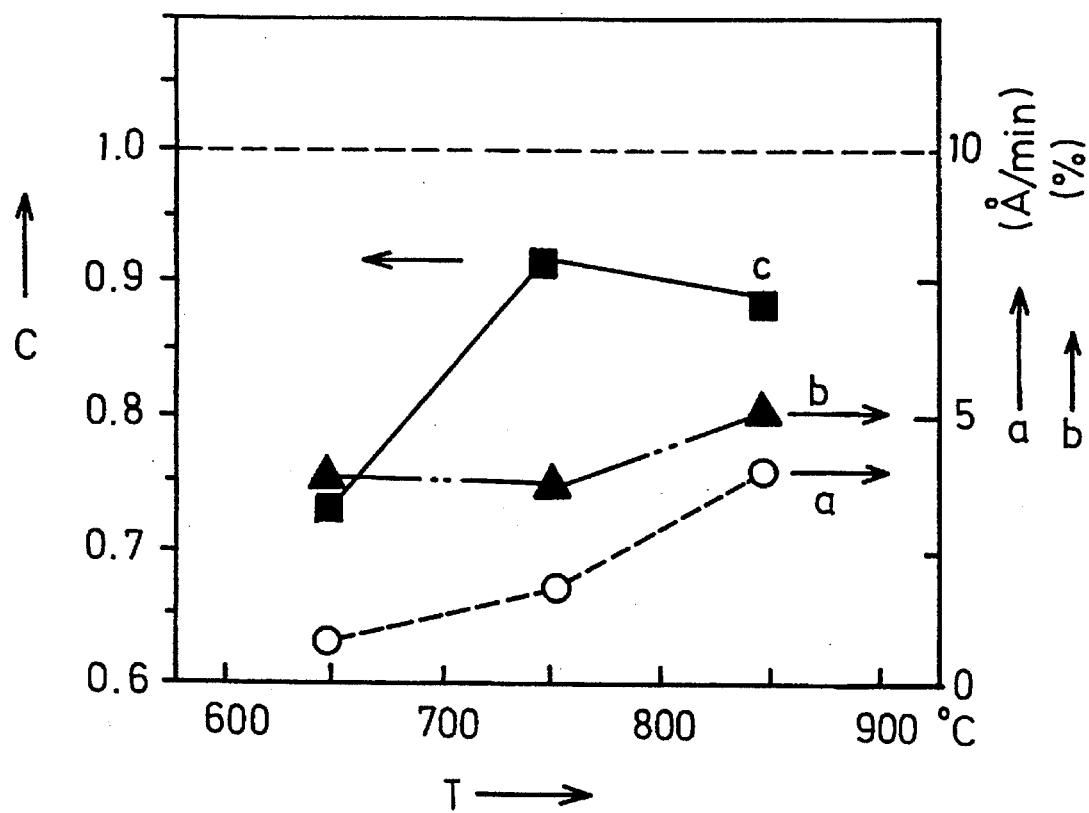
FIG. 8 is a diagram showing a result of a simulation obtained by applying the process simulator shown in FIG. 1 to formation of a silicon nitride film for dielectrics of a capacitor by a low pressure chemical vapor deposition (LPCVD) method.
Figure 9:
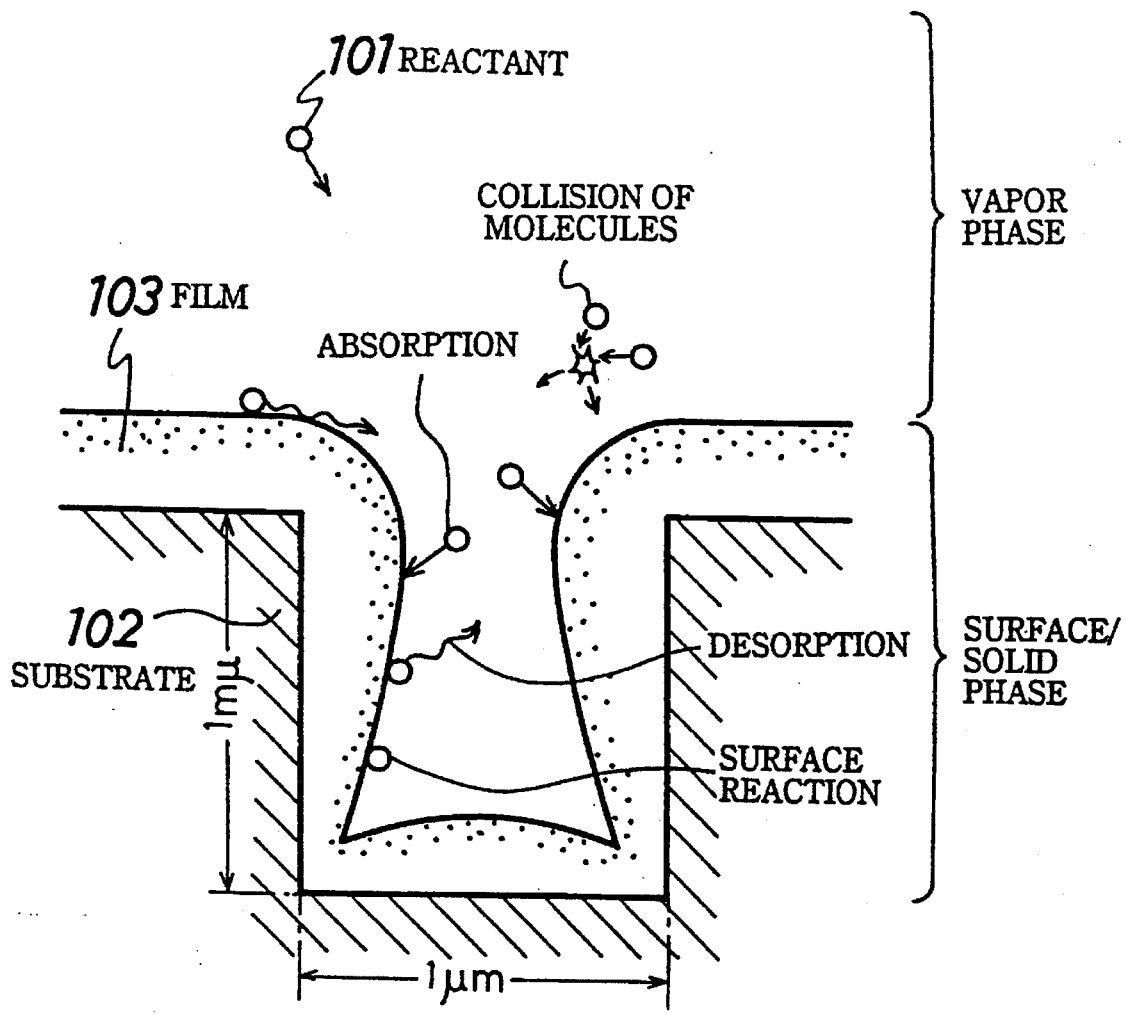
FIG. 9 is an illustrative view showing a model of a conventional CVD simulation.

An example of a result of the simulation described above is illustrated in FIG. 8. Referring to FIG. 8, where the pressures of the gasses and the ratio of the gas flow rates are fixed, the result of the simulation indicates that the process temperature of 750° C. is an optimum temperature which provides the best coverage ratio. The optimum process conditions obtained by the simulation are sent to the CVD process execution section 33 so that a film having a good step coverage is formed in the CVD process execution section 33.

The time required for simulating the growth of a silicon nitride film of 100 angstroms thick using the present embodiment is about 5 minutes for one process condition for the vapor phase reaction step and about 3 minutes for one process condition for the film deposition step. Consequently, the total time required for the entire simulation to obtain the result illustrated in FIG. 8 is about 30 minutes including setting of conditions.

Having now fully described the invention, it will be apparent to one of ordinary skill in the art that many changes and modifications can be made thereto without departing from the spirit and scope of the invention as set forth herein.

What is claimed is:

1. A process simulation method wherein a plurality of parameters required to determine optimum process conditions which provide the best step coverage of a dielectric film for a capacitor to be formed on a semiconductor substrate by a chemical vapor deposition method by supplying a plurality of raw material gases to the semiconductor substrate are inputted as values defining given variation ranges and the thus inputted parameters are individually varied to select optimum process conditions, comprising the steps of:

setting a plurality of process condition sets of different combinations from the plurality of inputted parameters;

recalling, from a data base in which vapor phase reactions and film surface reactions individually corresponding to a plurality of process condition sets are stored as models obtained by a non-empirical modeling method in advance, those of the vapor phase reaction models and the film surface reaction models which correspond to the individual process condition sets determined at the setting step; and executing simulations of vapor phase reactions and film surface reactions by the thus recalled vapor phase reaction models and film growth models and comparing results of the simulations with each other to select optimum process conditions.

2. A process simulator, comprising:

an inputting apparatus for inputting a plurality of parameters required to determine optimum process conditions, which provide the best step coverage to a dielectric film for a capacitor to be formed on a semiconductor substrate by a chemical vapor deposition method by supplying a plurality of raw material gases to the semiconductor substrate, as values defining given variation ranges;

a simulator section for individually varying the parameters inputted from said inputting apparatus to select optimum process conditions; and a storage apparatus for storing vapor phase reaction models and film surface reaction models individually corresponding to a plurality of process condition sets each of which is a combination of a plurality of parameters as models obtained by a non-empirical modeling method in advance;

said simulator section including a simulation condition setting apparatus for setting a plurality of process condition sets which are each a combination of a plurality of parameters inputted from said inputting apparatus, a reaction model setting apparatus for recalling vapor phase reaction models and film growth models from said storage apparatus in response to the process condition sets supplied from said simulation condition setting apparatus, and a simulation execution apparatus for executing simulations of vapor phase reactions and film surface reactions in accordance with the vapor phase reaction step and the film growth models supplied from said reaction model setting apparatus and comparing results of the simulations with each other to determine optimum process conditions.

3. A process simulator as claimed in claim 2, wherein the non-empirical modeling method is ab-initio molecular orbital method based on a principle of the quantum chemistry by which an orbit of individual molecules of raw material gas is obtained by numerical calculation.

4. A process simulator as claimed in claim 2, wherein the plurality of raw material gases include SiH2Cl2 or SiH4 and NH3.

5. A process simulator as claimed in claim 2, wherein the parameters to be inputted include kinds of the raw material gases, pressures of the individual raw material gases, and flow rates of the raw material gases.

6. A process simulator as claimed in claim 2, further comprising a reaction model developing section having a molecular orbital calculation program for developing a reaction model in accordance with the molecular orbital calculation program using the data stored in said storage apparatus.

7. A chemical vapor deposition system, comprising:

a process simulator as claimed in claim 2; and a chemical vapor deposition apparatus for receiving optimum process conditions from said process simulator and executing a process of a chemical vapor deposition method in accordance with the optimum process conditions.

* * * * *